(12) United States Patent
Hsieh

(10) Patent No.: US 10,853,239 B2
(45) Date of Patent: Dec. 1, 2020

(54) MEMORY CARD CONTROLLER, MEMORY CARD DEVICE, METHOD USED IN MEMORY CARD CONTROLLER, AND ELECTRONIC DEVICE COUPLED TO MEMORY CARD DEVICE

(71) Applicant: Silicon Motion Inc., Hsinchu County (TW)

(72) Inventor: Chao-Kuei Hsieh, New Taipei (TW)

(73) Assignee: SILICON MOTION INC., Hsinchu County (TW)

( * ) Notice: Subject to any disclaimer, the term of this patent is extended or adjusted under 35 U.S.C. 154(b) by 25 days.

(21) Appl. No.: 16/231,584

(22) Filed: Dec. 23, 2018

(65) Prior Publication Data

US 2019/0205068 A1 Jul. 4, 2019

Related U.S. Application Data

(60) Provisional application No. 62/610,937, filed on Dec. 28, 2017, provisional application No. 62/619,930, filed on Jan. 22, 2018.

(51) Int. Cl.
*G06F 3/08* (2006.01)
*G06F 12/02* (2006.01)
(Continued)

(52) U.S. Cl.
CPC ........ *G06F 12/0246* (2013.01); *G06F 3/0679* (2013.01); *G06F 3/08* (2013.01);
(Continued)

(58) Field of Classification Search
CPC ...... G06F 12/0246; G06F 3/0679; G06F 3/08; G11C 16/16; G11C 16/26; G11C 7/1063; G11C 7/109; G11C 7/20
See application file for complete search history.

(56) References Cited

U.S. PATENT DOCUMENTS

2005/0078025 A1 * 4/2005 Cai .................. H03M 1/164
341/162
2008/0172515 A1 7/2008 Croxford
(Continued)

FOREIGN PATENT DOCUMENTS

| CN | 101650690 A | 2/2010 |
|---|---|---|
| CN | 101782870 A | 7/2010 |

(Continued)

OTHER PUBLICATIONS

Office Action (with Search Report) issued for Taiwan Patent Application No. 2018146579 dated Jun. 25, 2019 and an English translation thereof.
(Continued)

*Primary Examiner* — Thien M Le
(74) *Attorney, Agent, or Firm* — Duane Morris LLP

(57) ABSTRACT

A memory card controller coupled to a host device includes a processing circuit which is used for reading card specific data from a flash memory of a memory card to store the card specific data in a register wherein a multiply parameter and a basic capacity are marked in the card specific data and used for sending the card specific data to the host device to make the host device calculate a maximum capacity of the memory card according to the multiply parameter and the basic capacity marked in the card specific data.

24 Claims, 10 Drawing Sheets

(51) Int. Cl.
  *G11C 7/20* (2006.01)
  *G06F 3/06* (2006.01)
  *G11C 7/10* (2006.01)
  *G11C 16/16* (2006.01)
  *G11C 16/26* (2006.01)

(52) U.S. Cl.
  CPC .......... *G11C 7/109* (2013.01); *G11C 7/1063* (2013.01); *G11C 7/20* (2013.01); *G11C 16/16* (2013.01); *G11C 16/26* (2013.01)

(56) References Cited

U.S. PATENT DOCUMENTS

| | | | |
|---|---|---|---|
| 2008/0266924 A1 | 10/2008 | Abedifard | |
| 2009/0109749 A1* | 4/2009 | Sukegawa | G11C 11/5628 365/185.03 |
| 2009/0327644 A1 | 12/2009 | Lee et al. | |
| 2011/0153896 A1 | 6/2011 | Sugiyama et al. | |
| 2012/0173791 A1* | 7/2012 | Wang | G06F 12/0246 711/103 |
| 2012/0244806 A1* | 9/2012 | Sekiya | H04L 1/1671 455/41.2 |
| 2013/0242656 A1* | 9/2013 | Sakaue | G06F 11/1048 365/185.09 |
| 2014/0089568 A1 | 3/2014 | Chung | |
| 2015/0113198 A1 | 4/2015 | Li et al. | |
| 2017/0055845 A1* | 3/2017 | Mirov | A61B 5/0205 |
| 2017/0308318 A1 | 10/2017 | Yang | |
| 2019/0354499 A1* | 11/2019 | Stuart | H02J 7/0042 |

FOREIGN PATENT DOCUMENTS

| | | |
|---|---|---|
| CN | 102214482 A | 10/2011 |
| CN | 103268775 A | 8/2013 |
| CN | 103809920 A | 5/2014 |
| CN | 104679592 A | 6/2015 |
| KR | 10-0783988 B1 | 12/2007 |
| TW | M253045 | 2/1993 |
| TW | M253045 | 12/2004 |
| TW | I382306 | 1/2013 |
| TW | 201511013 A | 3/2015 |
| TW | I575375 | 3/2017 |
| TW | I575375 B | 3/2017 |
| TW | I599880 | 9/2017 |
| TW | I599880 B | 9/2017 |
| TW | 201741882 A | 12/2017 |

OTHER PUBLICATIONS

Chao-Kuei Hsieh, Title: Flash Memory Controller, SD Card Device, Method Used in Flash Memory Controller, and Host Device Coupled to SD Card Device, pending U.S. Appl. No. 16/231,589, filed Dec. 23, 2018.

"International Search Report" dated Apr. 1, 2019 for International application No. PCT/CN2018/124808, International filing date:Dec. 28, 2018.

"International Search Report" dated Apr. 3, 2019 for International application No. PCT/CN2018/124809, International filing date:Dec. 28, 2018.

First Office Action for related TW Application 107147893 dated Nov. 29, 2019. pp. 1-5.

* cited by examiner (1)

MEMORY CARD CONTROLLER, MEMORY CARD DEVICE, METHOD USED IN MEMORY CARD CONTROLLER, AND ELECTRONIC DEVICE COUPLED TO MEMORY CARD DEVICE

CROSS REFERENCE TO RELATED APPLICATIONS

This application claims priority of U.S. provisional application Ser. No. 62/610,937 filed on Dec. 28, 2017 and priority of U.S. provisional application Ser. No. 62/619,930 filed on Jan. 22, 2018, which are entirely incorporated herein by reference.

BACKGROUND OF THE INVENTION

1. Field of the Invention

The invention relates to a memory card communication scheme, and more particularly to a flash memory controller, a memory card, a method used in a flash memory controller, and a host device connected to the memory card.

2. Description of the Prior Art

Generally speaking, a currently developed communication scheme between a flash memory and a host device merely supports addressing of a 32-bit length logical address space at most. The host device sends a command and transmits an address parameter which merely indicates a 32-bit length logical address at most. This causes that the maximum capacity of the flash memory is limited at 2 TB (Trillion byte), and a conventional secure digital (SD) memory card usually is arranged to report the maximum capacity of 2 TB to the host device.

However, with the development and progress of technology and applications, for example, the requirement of image quality of a video recording function of a mobile phone becomes higher and higher, and there is a great probability that it is not enough for applications in the future to limit the maximum capacity of a flash memory at 2 TB. Thus, for the flash memory having the maximum capacity more than 2 TB, it is needed to provide a novel communication scheme to make the SD memory card be able to report the maximum capacity more than 2 TB to the host device as well as be able to support addressing capability of more than the 32-bit length logical address space.

SUMMARY OF THE INVENTION

Therefore one of the objectives of the invention is to provide a flash memory controller, a memory card device, a method utilized in the flash memory controller, and a host device connected to the memory card device which can support a novel communication scheme to make the memory card device report a more than 2 TB capacity to the host device as well as can support the capability of addressing of more than a 32-bit length logical address space. The provide solution can be compatible with a currently developed flash memory communication scheme. That is, the provide solution can make a memory card device report a less than 2 TB capacity to the host device as well as can support the capability of addressing of the 32-bit length logical address space.

According to embodiments of the invention, a memory card controller configured to couple to a host device via an external signal port and couple to a flash memory via an internal connection of a memory card device is disclosed. The memory card controller comprises a processing circuit. The processing circuit is used for reading card specific data from the flash memory to store the card specific data in a register wherein a multiplier parameter and a basic capacity are marked in the card specific data, and used for sending the card specific data to a processor of the host device via the external signal port and a memory card driving circuit of the host device if the processing circuit receives a request command CMD9 from the memory card driving circuit by the processor of the host device, to make the processor of the host device calculate and obtain a maximum capacity of the memory card device according to the multiplier parameter and the basic capacity marked in the card specific data. The marked basic capacity is represented by using 22 bits of a C_size field defined in the card specific data, and the marked multiplier parameter is represented by using N capacity indication bits in the card specific data to indicate a value within a range from zero to of M to indicate the multiplier parameter within a range from $2^0$ to $2^M$ wherein M is a positive integer greater than one.

According to the embodiments, a memory card device is disclosed. The memory card device comprises the above-mentioned memory card controller and a flash memory.

According to the embodiments, a method utilized in a memory card controller configured to couple to a host device via an external signal port and couple to a flash memory via an internal connection of a memory card device is disclosed. The method comprises: reading card specific data from the flash memory to store the card specific data in a register wherein a multiplier parameter and a basic capacity are marked in the card specific data; and, sending the card specific data to a processor of the host device via the external signal port and a memory card driving circuit of the host device if the processing circuit receives a request command CMD9 from the memory card driving circuit by the processor of the host device, to make the processor of the host device calculate and obtain a maximum capacity of the memory card device according to the multiplier parameter and the basic capacity marked in the card specific data; wherein the marked basic capacity is represented by using 22 bits of a C_size field defined in the card specific data, and the marked multiplier parameter is represented by using N capacity indication bits in the card specific data to indicate a value within a range from zero to of M to indicate the multiplier parameter within a range from $2^0$ to $2^M$ wherein M is a positive integer greater than one.

According to the embodiments, an electronic device configured to couple to a memory card device via an external signal port is disclosed. The electronic device comprises a memory card driving circuit and a processor. The memory card driving circuit is used for driving the memory card device. The processor is coupled to the memory card driving circuit, and used for sending a request command CMD9 to a memory card controller of the memory card device via the memory card driving circuit, and used for receiving card specific data which is sent by the memory card controller of the memory card device in response to the request command CMD9, and used for analyzing and reading a multiplier parameter and a basic capacity marked in the card specific data, and for calculating and obtaining a maximum capacity of the memory card device according to the multiplier parameter and the basic capacitor which are marked in the card specific data. The marked basic capacity is represented by using 22 bits of a C_size field defined in the card specific data, and the marked multiplier parameter is represented by using N capacity indication bits in the card specific data to indicate a value within a range from zero to of M to indicate the multiplier parameter within a range from $2^0$ to $2^M$ wherein M is a positive integer greater than one.

According to the embodiments, a method utilized in an electronic device configured to couple to a memory card device via an external signal port is disclosed. The electronic device has a processor and a memory card driving circuit to drive the memory card device, and the method comprises: using the memory card driving circuit to drive the memory card device; sending a request command CMD9 to a memory card controller of the memory card device via the memory card driving circuit; receiving card specific data which is sent by the memory card controller of the memory card device in response to the request command CMD9; analyzing and reading a multiplier parameter and a basic capacity marked in the card specific data; and calculating and obtaining a maximum capacity of the memory card device according to the multiplier parameter and the basic capacitor which are marked in the card specific data; wherein the marked basic capacity is represented by using 22 bits of a C_size field defined in the card specific data, and the marked multiplier parameter is represented by using N capacity indication bits in the card specific data to indicate a value within a range from zero to of M to indicate the multiplier parameter within a range from $2^0$ to $2^M$ wherein M is a positive integer greater than one.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
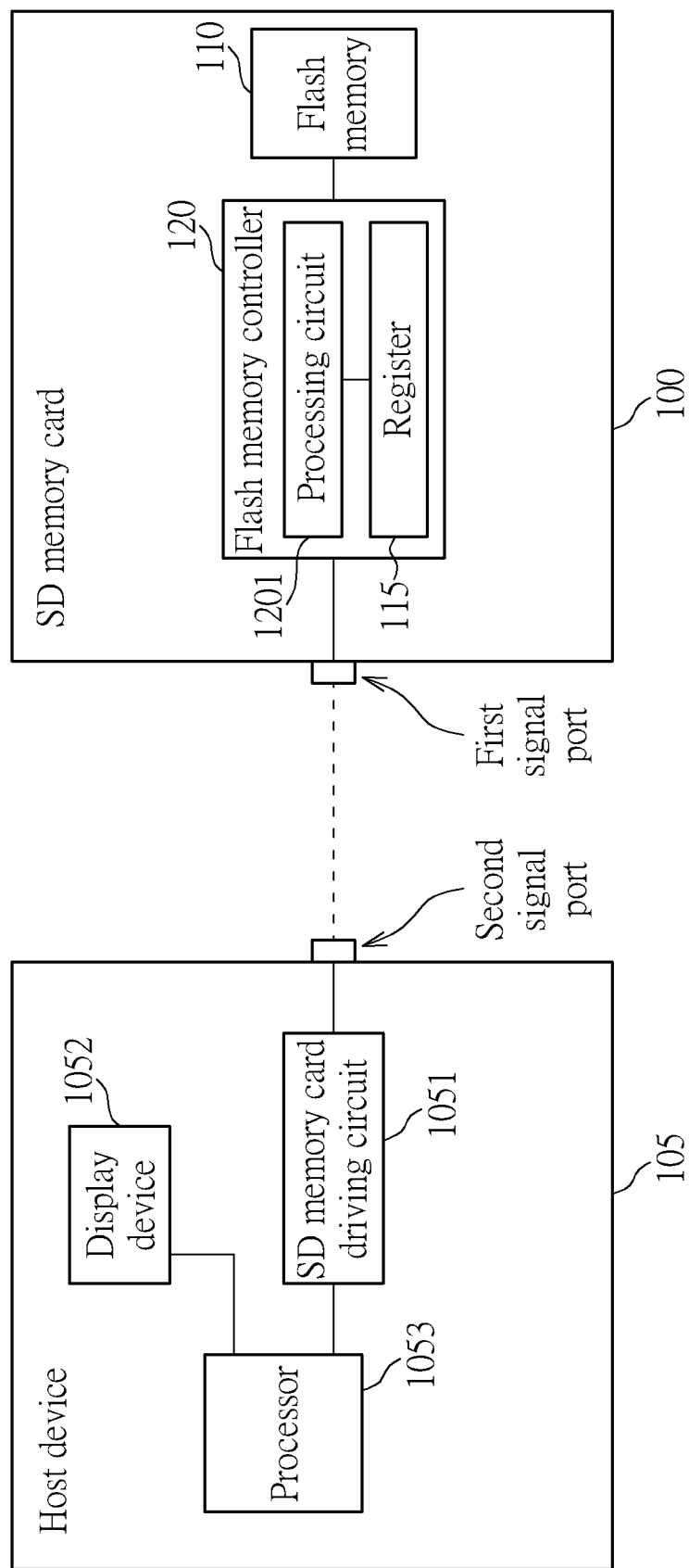
FIG. 1 is a block diagram showing a memory card device and an electronic device such as a host device according to embodiments of the invention.

Refer to FIG. 1, which is a block diagram showing a memory card device 100 and an electronic device 105 such as a host device according to embodiments of the invention. The memory card device 100 for example is connected to at least one second external signal port of host device 105 via at least one first external signal port of its communication interface such as USB interface (but not limited) to be connected to the memory card driving circuit 1051 of host device 105. The memory card device 100 comprises a flash memory 110 (comprising one or more flash memory chips) and a flash memory controller 120. The flash memory controller 120 is connected to the at least one first external signal port, and data transmission/communication between the flash memory controller 120 and the flash memory 110 is transferred via an internal bus. The host device 105 comprises a memory card driving circuit 1051, a display device 1052, and a processor 1053. The controller 120 at least comprises a processing circuit 1201 and a register 115. The memory card device 100 for example is an SD memory card such as SDHC card, SDXC card, SDUC card, PCIe SD card, or NVMe SD card. The memory card driving circuit 1051 for example is an SD memory card driving circuit. It should be noted that the memory card device 100 is not limited to the SD memory card. In other embodiments, the memory card device 100 can be other different types of memory cards. The processor 1053 of host device 105 communicates with the processing circuit 1201 of controller 120, e.g., transmission and reception of a control command, via the SD memory card driving circuit 1051, the at least one second external signal port, the at least one first external signal port. In addition, the memory card controller 120 performs a processing operation upon the flash memory 110 via the internal bus.

When the memory card device 100 is powered, the controller 120 is arranged to read basic characteristics information from the flash memory 110 via the internal bus and then store the information in the register 115. The basic characteristics information for example is card specific data (CSD). The processing circuit 1201 of controller 120 can detect and check the characteristics of flash memory 110 and write the basic characteristics information into the register 115.

When the host device 105 communicates with the SD memory card 100 during initialization, the processor 1053 is arranged to write a command to a register (not shown on FIG. 1) of the host device 105, and then the SD memory card driving circuit 1051 reads such command from the register to send a request command to the controller 120 of SD memory card 100 sequentially via the at least one second external signal port and the at least one first external signal port, to ask the SD memory card 100 to report information back to the host device 105. For example, the host device 105 sends a request command CMD9 to the SD memory card 100 to ask the card 100 report the CSD. After receiving the request command CMD9, the controller 120 of SD memory card 100 outputs and reports the CSD stored in the register 115 to the host device 105. The controller 120 obtains the CSD from the register 115 and then transmits the CSD to the processor 1053 of host device 105 sequentially via the at least one first external signal port, the at least one second external signal port, and the SD memory card driving circuit 1051. The processor 1053 can calculate and/or obtain the information of the flash memory 110 based on the CSD. It should be noted that in practice the SD memory card driving circuit 1051 is operative with corresponding driver software to implement functions of command transmission and information transmission.

The CSD information is generated by a memory card manufacturer to use a card initialization device to load a specific card initialization program to generate the CSD when the manufacturer generates an SD memory card device. The card initialization program for example is provided by an SD memory controller manufacturer. For instance, after the memory card manufacturer decides the type of a flash memory and selects a corresponding controller, the memory card manufacturer initializes the flash memory by using the specific card initialization program provided by the SD memory controller manufacturer. The memory card manufacturer determines a maximum capacity of the SD card and is arranged to write CSD information corresponding to the maximum capacity into the flash memory permanently like burning data for the flash memory.

A flash memory for example is able to support a maximum capacity of 300 TB. If the memory card manufacturer would like to generate an SD memory card having a maximum capacity of merely 2 TB, the memory card manufacturer can be arranged to mark corresponding information at a predetermine field of the CSD information to be permanently written into the flash memory. Alternatively, if the memory card manufacturer would like to generate an SD memory card having a maximum capacity of merely 300 TB, the memory card manufacturer can be arranged to further mark additional capacity information at other reserved/idle field(s) of the CSD information to be permanently written into the flash memory in addition to marking corresponding information at the predetermine field. Thus, by referring to the above-mentioned information permanently written, a host device to be connected to such SD memory card can obtain that such SD memory card supports the maximum capacity of 300 TB.

In a first embodiment, when generating the SD memory card 100 for mass production, the card initialization device of the memory card manufacturer can be arranged to mark a multiplier parameter in the CSD of the SD memory card 100 wherein the multiplier parameter is used for calculating the maximum capacity of flash memory 110. After the controller 120 reports the CSD stored in the register 115 to host device 105, the processor 1053 of host device 105 is able to obtain the corresponding information of a basic capacity and the additional capacity information, marked by the memory card manufacturer, from the CSD, and thus can calculate and obtain the maximum capacity of the SD memory card 100 (i.e. the maximum capacity of flash memory 110). This makes that the upper limit of the maximum capacity of the flash memory 110 reported to the host device 105 can be extended as far as possible and is not limited to the maximum capacity 2 TB of a conventional flash memory.

Taking an example of the CSD, the CSD may comprise a 128-bit data structure [127:0]. Two bits such as [127:126] may be used for recording the version information of this flash memory. 22 bits such as the C_size field [69:48] is used for recording a capacity of a flash memory. In the embodiment, the C_size field is used as a basic capacity and the maximum value of the basic capacity corresponds to the upper limit of the 32-bit length logical address space.

However, the 22 bits (i.e. the C_size field [69:48]) at most indicate a capacity of 2 TB, and cannot indicate a capacity of more than 2 TB. Accordingly, it is inopportune.

To solve the above-mentioned problem, the provided method of the invention is to employ other N bits in the CSD to indicate the multiplier parameter for the maximum capacity of the flash memory. For example, the multiplier parameter is equal to two to the power of N, i.e., $2^N$, and N for example is equal to 5. The N bits can be implemented by using five bits which are original used as reserved/idle bits of the CSD, e.g. [75:70], to indicate the multiplier parameter for the maximum capacity of the flash memory. The five bits in the following descriptions are defined as capacity indication/indicator/mark bits or first bits. The five bits can be used to indicate a value range from 0 to 31. Thus, the multiplier parameter ranges from a value of two to the power of zero to a value of two to the power of 31, i.e. $2^0$-$2^{31}$. The five bits for example may be from '00000' to '11111' to indicate a value range from zero to 32. When the five bits are used to indicate a value of 32, the five bits can be used with the C_size field (which can indicate a basic capacity of 2 Tb at most) to indicate the maximum capacity supporting the addressing of a 64-bit length address space. In addition, in other embodiments, six idle bits in the CSD, e.g. [75:70], may be employed as capacity indication bits. The six bits for example may be from '000000' to '100000' to indicate a value range from zero to 32. When the six bits are used to indicate a value of 32, the six bits can be also used with the C_size field (which can indicate a basic capacity of 2 Tb at most) to indicate the maximum capacity supporting the addressing of a 64-bit length address space. It should be noted that the value of N is not meant to be a limitation. Also, the multiplier parameter is not limited as $2^N$. In other embodiments, the multiplier parameter may be configured as another different integer to the power of N such as four to the power of N.

Figure 2:
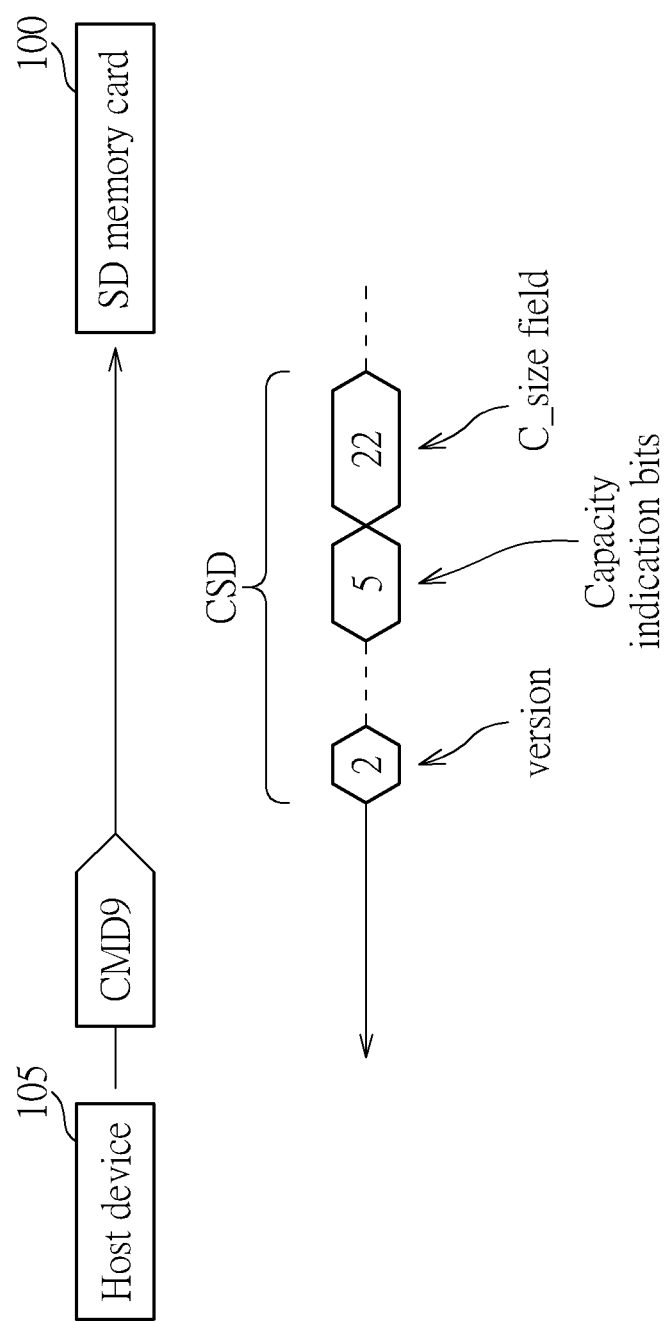
FIG. 2 is a diagram of an example of data communication via the specific communication interface between the host device and SD memory card for the maximum capacity communication according to the embodiments of the invention.

Refer to FIG. 2, which is a diagram of an example of data communication via the specific communication interface between the host device 105 and SD memory card 100 for the maximum capacity communication according to the embodiments of the invention. As shown in FIG. 2, the host device 105 sends the request command CMD9 to the SD memory card 100, and the SD memory card 100 reports the CSD back to the host device 105 wherein two bits are used for indicating the version of the CSD and the above-mentioned five capacity indication bits can be the five bits configured before the C_size field. However, this is not intended to be a limitation.

The cad initialization device of the memory card manufacturer can set the version of the CSD according to whether the maximum capacity of flash memory 110 exceeds above a specific capacity such as the maximum capacity of 2 TB corresponding to the addressing of a 32-bit length address space. For example, if the maximum capacity of flash memory 110 is not larger than 2 TB, then the memory card manufacturer is arranged to set the version of such CSD as an old version to indicate that this flash memory supports the capacity of 2 TB at most, to make the SD memory card 100 is compatible with an existing conventional host device. Thus, even though the SD memory card with functions of a new version can be configured as the old version to be compatible with a host device with merely old versions of driver software. In addition, the old versions of driver software installed in the host device can be updated to a newer version. If the maximum capacity of flash memory 110 exceeds above 2 TB, then the card initialization device of the memory card manufacturer is arranged to configure the version of the CSD as a new version to indicate that this flash memory can support more than 2 TB capacity.

Thus, when receiving the CSD reported by the controller 120, the processor 1053 of host device 105 can preliminarily determine whether the maximum capacity of this flash memory 110 exceeds above the maximum capacity 2 TB of a 32-bit length address space, by checking the version of the CSD. If the version is an old version, then the processor 1053 is arranged to determine the maximum capacity of this flash memory 110 according to the value indicated by the 22 bits of the C_size field. If the version is a new version, then the processor 1053 is arranged to calculate the maximum capacity based on the multiplier parameter pointed out by the five capacity indication bits mentioned above in addition to referring to the 22 bits of the C_size field.

As mentioned above, when the host device 105 receives the CSD, the processor 1053 can refer to the value represented by the 22 bits of C_size field and the value represented by the above-mentioned five capacity indication bits to calculate the maximum capacity of the flash memory 110. In other words, instead of directly notifying the host device 105 of the maximum capacity, the SD memory card 100 is arranged to mark a multiplier of the capacity of a flash memory in the data structure of the CSD to make the processor 1053 calculate the maximum capacity of the flash memory 110 by itself. For example, refer to the following table. The following table shows multiple examples of the information in the CSD:

| Capacity indicated by C_size field (22 bits) | Value M represented by N capacity indication bits | Multiplier parameter ($2^M$) | Maximum capacity |
|---|---|---|---|
| 1.5 TB | 0 | $2^0$ | 1.5 TB |
| 1.5 TB | 1 | $2^1$ | 3 TB |
| 2 TB | 0 | $2^0$ | 2 TB |
| 1 TB | 1 | $2^1$ | 2 TB |
| 2 TB | 1 | $2^1$ | 4 TB |
| 2 TB | 23 | $2^{23}$ | 16 EB |
| 1.25 TB (27FFFF) | 1 | $2^1$ | 2.5 TB |
| 1.5 TB (2FFFFF) | 1 | $2^1$ | 3 TB |
| 1.875 TB (3BFFFF) | 4 | $2^4$ | 30 TB |
| 1.171875 TB (257FFF) | 8 | $2^8$ | 300 TB |
| 1.46484375 TB (2EDFFF) | 11 | $2^{11}$ | 3000 TB |

As mentioned above, the C_size field is arranged to indicate information of a basic capacity of a flash memory. For example, the value of C_size field can be used to indicate the capacity of 2 TB at most. In one embodiment, to indicate that a flash memory has the maximum capacity of 1.5 TB, the card initialization device of the memory card manufacturer can be arranged to set the value represented by the bits of C_size field to correspond to 1.5 TB, and to set the value represented by N bits as zero; i.e. the multiplier parameter is configured as $2^0=1$. Accordingly, after receiving the CSD, the processor 1053 of host device 105 can calculate and obtain that the maximum capacity of the flash memory 110 is equal to 1.5 TB.

In another embodiment, to indicate that the flash memory has the maximum capacity of 3 TB, the card initialization device of the memory card manufacturer can be arranged to set the value represented by the bits of C_size field to correspond to 1.5 TB, and to set the value represented by N bits as one; i.e. the multiplier parameter is configured as $2^1=2$. Accordingly, after receiving the CSD, the processor 1053 of host device 105 can calculate and obtain that the maximum capacity of the flash memory 110 is equal to 3 TB.

In another embodiment, to indicate that the flash memory has the maximum capacity of 2 TB, the card initialization device of the memory card manufacturer can be arranged to set the value represented by the bits of C_size field to correspond to 2 TB, and to set the value represented by N bits as zero; i.e. the multiplier parameter is configured as $2^0=1$. Accordingly, after receiving the CSD, the processor 1053 of host device 105 can calculate and obtain that the maximum capacity of the flash memory 110 is equal to 2 TB.

Further, in other embodiments, the card initialization device of the memory card manufacturer can be also arranged to set the value represented by the bits of C_size field to correspond to 1 TB, and to set the value represented by N bits as one; i.e. the multiplier parameter is configured as $2^1=2$. Accordingly, after receiving the CSD, the processor 1053 can calculate that the maximum capacity of the flash memory 110 is equal to 2 TB. That is, the card initialization device of the memory card manufacturer can be arranged to use a variety of settings and marks to indicate the same capacity size.

In one embodiment, to indicate that the flash memory has the maximum capacity of 4 TB, the card initialization device of the memory card manufacturer can be arranged to set the value represented by the bits of C_size field to correspond to 2 TB, and to set the value represented by N bits as one; i.e. the multiplier parameter is configured as $2^1=2$. Accordingly, after receiving the CSD, the processor 1053 of host device 105 can calculate and obtain that the maximum capacity of the flash memory 110 is equal to 4 TB.

In one embodiment, to indicate that the flash memory has the maximum capacity of 16 EB, the card initialization device of the memory card manufacturer can be arranged to set the value represented by the bits of C_size field to correspond to 2 TB, and to set the value represented by N bits as 23; i.e. the multiplier parameter is configured as two to the power of 23, $2^{23}$. Accordingly, after receiving the CSD, the processor 1053 of host device 105 can calculate and obtain that the maximum capacity of the flash memory 110 is equal to 16 EB.

Further, to indicate that the flash memory has the maximum capacity of 2.5 TB, the card initialization device of the memory card manufacturer can be arranged to set the value represented by the bits of C_size field to correspond to 1.25 TB, and to set the value represented by N bits as one; i.e. the multiplier parameter is configured as $2^1=2$. Accordingly, after receiving the CSD, the processor 1053 of host device 105 can calculate and obtain that the maximum capacity of the flash memory 110 is equal to 2.5 TB.

In other examples, to indicate that the flash memory has the maximum capacity of 3 TB, the card initialization device of the memory card manufacturer can be arranged to set the value represented by the bits of C_size field to correspond to 1.5 TB, and to set the value represented by N bits as one; i.e. the multiplier parameter is configured as $2^1=2$. Accordingly, after receiving the CSD, the processor 1053 of host device 105 can calculate and obtain that the maximum capacity of the flash memory 110 is equal to 3 TB.

Further, to indicate that the flash memory has the maximum capacity of 30 TB, the card initialization device of the memory card manufacturer can be arranged to set the value represented by the bits of C_size field to correspond to 1.875 TB, and to set the value represented by N bits as four; i.e. the multiplier parameter is configured as $2^4=16$. Accordingly, after receiving the CSD, the processor 1053 of host device 105 can calculate and obtain that the maximum capacity of the flash memory 110 is equal to 30 TB.

Further, to indicate that the flash memory has the maximum capacity of 300 TB, the card initialization device of the memory card manufacturer can be arranged to set the value represented by the bits of C_size field to correspond to 1.171875 TB, and to set the value represented by N bits as eight; i.e. the multiplier parameter is configured as $2^8$. Accordingly, after receiving the CSD, the processor 1053 of host device 105 can calculate and obtain that the maximum capacity of the flash memory 110 is equal to 300 TB.

Further, to indicate that the flash memory has the maximum capacity of 3000 TB, the card initialization device of the memory card manufacturer can be arranged to set the value represented by the bits of C_size field to correspond to 1.46484375 TB, and to set the value represented by N bits as eleven; i.e. the multiplier parameter is configured as $2^{11}$. Accordingly, after receiving the CSD, the processor 1053 of host device 105 can calculate and obtain that the maximum capacity of the flash memory 110 is equal to 3000 TB.

The provided method of the invention is arranged to employ a field of N capacity indication bits in the CSD to indicate a value of the multiplier parameter ($2^N$) for capacity, to significantly extend the indication of the upper limit of the maximum capacity of a flash memory. Compared to the conventional method adopting merely the C_size field to indicate that the maximum capacity of a flash memory has 2 TB at most, the provided method can extend the indication of the upper limit of the maximum capacity of a flash memory as well as avoid using too many bits for implementation by using the multiplier parameter equal to an integer to the power of N. For example, by employing the five capacity indication bits to indicate the multiplier parameter and using the 22 bits of C_size field, it can indicate that a flash memory may have the capacity of 16 EB at most, i.e. the upper limit of the maximum capacity.

Figure 3:
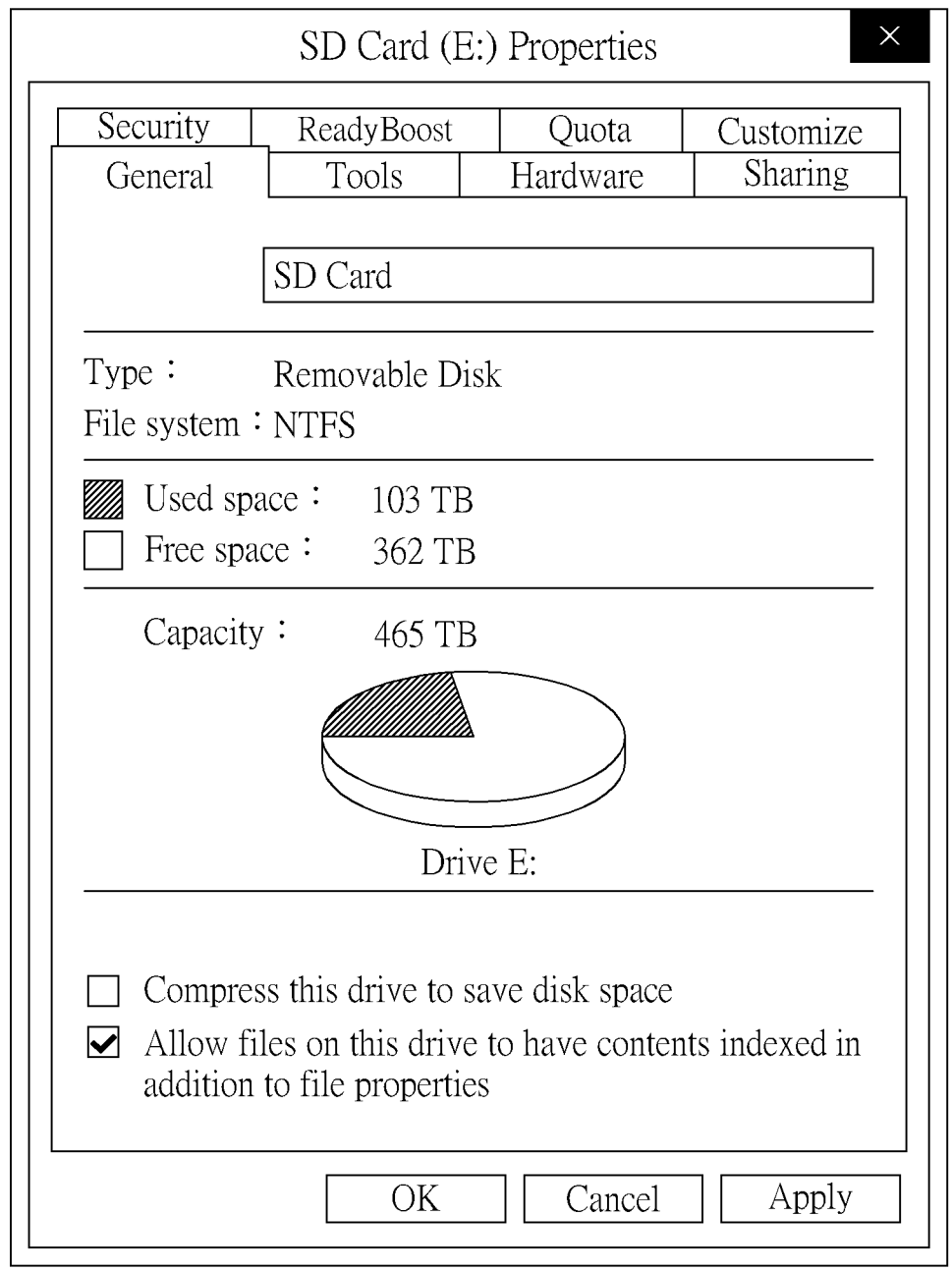
FIG. 3 is a diagram of an example of the processor of the host device displaying a calculation result of the maximum capacity of the flash memory on the display device according to embodiments of the invention.

Further, when receiving the CSD, the processor 1053 of host device 105 can calculate and obtain the maximum capacity of the flash memory 110 and then display a calculation result on the display device 1052 to make the user know the maximum capacity of the flash memory 110. Refer to FIG. 3. FIG. 3 is a diagram of an example of the processor 1053 of host device 105 displaying a calculation result of the maximum capacity of the flash memory 110 on the display device 1052 according to embodiments of the invention. The display device 1052 is capable of displaying that the maximum capacity of flash memory 110 is equal to 465 TB (i.e. exceeds above 2 TB), the used capacity space is equal to 103 TB, and the available capacity space is equal to 362 TB. It should be noted that the above values and display contents are merely used for illustrative purposes and are not meant to be limitations of the invention.

Further, in other embodiments, when the host device 105 calculates to obtain the maximum capacity of the flash memory 110, the processor 1053 is arranged to control the SD memory card driving circuit 1051 to send different bit-length logical addresses to the controller 120 of SD memory card 100 sequentially via the at least one second external signal port and the at least one first external signal port according to the maximum capacity, to make the controller 120 of SD memory card 100 convert logical addresses into physical addresses and then perform a corresponding processing operation upon the flash memory 110 via the internal bus according to the physical addresses. For example, in this embodiment, if the maximum capacity is not larger than 2 TB, then the host device 105 is arranged to control the SD memory card driving circuit 1051 to send a 32-bit length logical address to the controller 120 of SD memory card 100 sequentially via the at least one second external signal port and the at least one first external signal port wherein the 32-bit length logical address supports the addressing of a logical capacity space size of 2 TB. Instead, if the maximum capacity is larger than 2 TB, then the host device 105 is arranged to control the SD memory card driving circuit 1051 to send a longer bit-length logical address to the controller 120 of SD memory card 100 sequentially via the at least one second external signal port and the at least one first external signal port wherein the longer bit-length logical address has a bit length longer than 32-bit length and can supports the addressing of a logical capacity space size of more than 2 TB. The longer bit length for example is a 38-bit length or a 64-bit length and depends on the maximum capacity of the flash memory 110.

For addressing compatibility of the 32-bit length logical address space and a longer bit length logical address space such as the 38-bit length or 64-bit length logical address space, it is not necessary and required for the provided method of the invention to further implement other pin(s) or connection port(s). The provided method is arranged to employ the same pin or connection port applied for the 32-bit length logical address space to implement the addressing of a longer bit length logical address space. The host device 105 can be arranged to send a variety of different commands carrying information of a longer bit length logical address to the SD memory card 100 via the same pin or connection port applied for the 32-bit length logical address space, i.e. the at least one second external signal port and the at least one first external signal port.

In the following embodiments, the driving circuit 1051 of host device 105 is arranged to send a first command and transmit a first partial address parameter capable of carrying at most a 32-bit length address parameter, and then to send a second command and transmit a second partial address parameter capable of carrying at most another 32-bit length address parameter, so as to make the controller 120 of SD memory card 100 be able to combine and obtain a longer bit-length address parameter (which is an address longer than a 32-bit length address) after receiving the first partial address parameter and the second partial address parameter. For example, the controller 120 can combine and obtain a complete 64-bit length address parameter from the two 32-bit length addresses and then perform an operation of a command queue task assignment, data unit read/write, or data unit erase according to a command type of the second command. It should be noted that the first command for example can be implemented by using a command which is a reserved command specified in the SD memory card specification, e.g. one of commands CMD22, CMD31, CMD39, CMD41, CMD51, and so on. In addition, the first partial address parameter and second partial address parameter are not limited to 32-bit length addresses. The processor 1053 of host device 105 can determine the total bit-length formed by the first partial address parameter and second partial address parameter according to the actual maximum capacity of the flash memory 110. For example, if the maximum capacity is equal to 128 TB, then the total bit length can be determined as a 38-bit length wherein the first partial address parameter for example indicates a 6-bit length and the second partial address parameter indicates a 32-bit length. However, this is not intended to be a limitation. The first partial address parameter and second partial address parameter can be variable. In addition, a data unit mentioned above means data amount of a storage page or data amount of a storage block; this is not meant to be a limitation.

Figure 4:
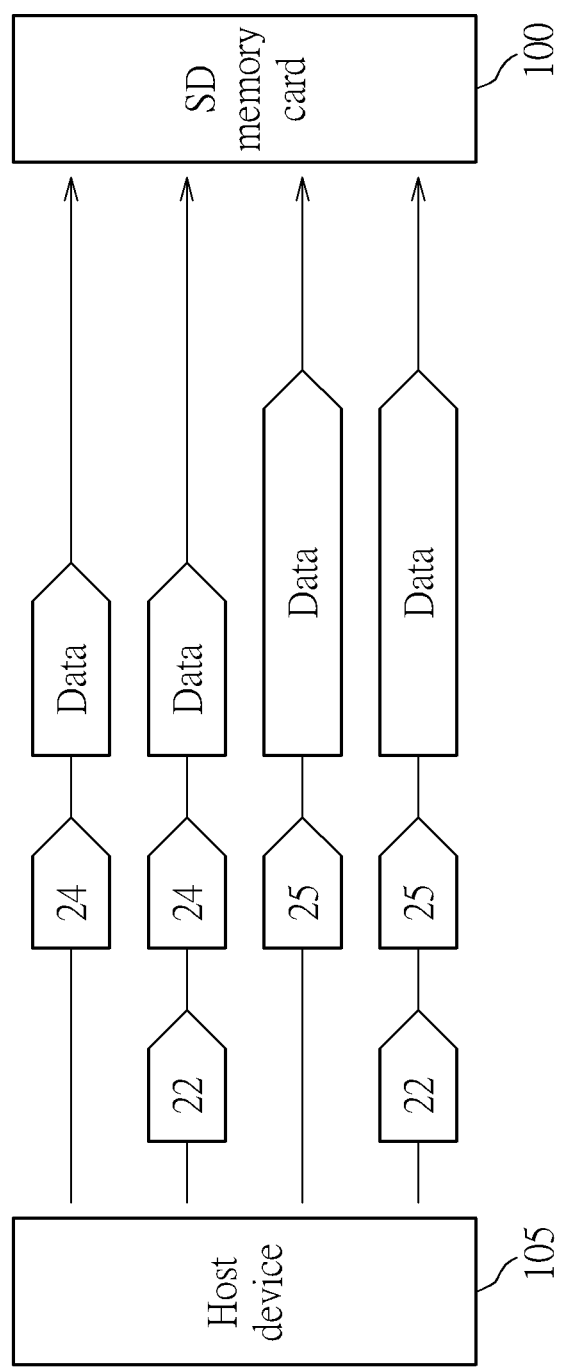
FIG. 4 is a diagram of the host device sending different commands to the SD memory card to write data units with different bit-length logical addresses.

Refer to FIG. 4, which is a diagram of the host device 105 sending different commands to the SD memory card 100 to write data units with different bit-length logical addresses. As shown in FIG. 4, for sending a write command carrying a 32-bit length logical address to the SD memory card 100, the host device 105 for example controls the SD memory card driving circuit 1051 to send a command CMD24 and transmit a 32-bit length address parameter such as a logical address of a data unit to the controller 120 of SD memory card 100 sequentially via the at least one second external signal port and the at least one first external signal port, and then to send a data unit to the controller 120 of SD memory card 100 via the above same path, so that the controller 120 writes the data unit corresponding to the 32-bit length logical address into the flash memory 110 via the internal bus after receiving the write command and the data unit.

For sending a write command and a longer bit-length address such as a 64-bit length logical address to the SD memory card 100, the host device 105 for example controls the SD memory card driving circuit 1051 to send a specific command, e.g. a first command CMD22 (but not limited), and transmits a first partial address parameter such as 32 most significant bits of the 64-bit length logical address (which can be regarded as a first 32-bit length logical address) to the controller 120 of SD memory card 100 sequentially via the at least one second external signal port and the at least one first external signal port. The SD memory card driving circuit 1051 then sends a command CMD24 and transmits a second partial address parameter such as 32 least significant bits of the 64-bit length logical address (which can be regarded as a second 32-bit length logical address) to the controller 120 of SD memory card 100 sequentially via the at least one second external signal port and the at least one first external signal port. Then the driving circuit 1051 sends a data unit to the controller 120 via the above identical path so that the controller 120 can write the data unit corresponding the 64-bit length logical address into the flash memory 110 via the internal bus after receiving the above two commands and such data unit.

Further, in another embodiment, the host device 105 can be arranged to send a command CMD20 to the SD memory card 100 via the same signal path before sending the command CMD22, to indicate a video speed class data writing.

It should be noted that in the following embodiments the operation of sending a command from the host device 105 to the controller 120 of SD memory card 100 uses a signal path which is identical to the above signal path. Instead, for the operation of sending data from the controller 120 to the host device 105, the data is transmitted via the at least one first external signal port and the at least one second external signal port sequentially. The description is not detailed for brevity.

For writing multiple data units, when sending a multiple data unit write command carrying a 32-bit length logical address to the SD memory card 100, the host device 105 for example controls the SD memory card driving circuit 1051 to send a command CMD25 and transmit a 32-bit length address parameter such as a logical address to the SD memory card 100, and then to send multiple data units to the SD memory card 100 to write the multiple data units associated with the 32-bit length logical address wherein the 32-bit length logical address can be a write start logical address for the multiple data units.

Further, when sending a 64-bit length logical address and a multiple data unit write command to the SD memory card 100, the host device 105 for example controls the SD memory card driving circuit 1051 to send a specific command such as the first command CMD22 carrying a first partial address parameter such as 32 most significant bits of the 64-bit length logical address to the SD memory card 100, then to send the command CMD25 carrying a second partial address parameter such as 32 least significant bits of the 64-bit length logical address to the SD memory card 100, and then to send the multiple data units to the SD memory card 100, so as to write the multiple data units associated with the 64-bit length logical address which is the 64-bit length address parameter which can be formed by combining the first partial address parameter and the second partial address parameter and may be a write start logical address for the above-mentioned multiple data units.

Thus, the processing circuit 1201 can obtain the first partial address parameter when receiving the specific command such as command CMD22, then obtain the second partial address parameter when receiving the command CMD24 or CMD 25, and then can combine the first partial address parameter and second partial address parameter to obtain the 64-bit length address parameter, and then can determine that a subsequent operation is a single data unit write operation or a multiple data unit write operation according to the command type of the command CMD24 or CMD25 and thus perform the single data unit write operation or the multiple data unit write operation based on the 64-bit length logical address. Instead, if the processing circuit 1201 of controller 120 merely receives the second partial address parameter transmitted from the command CMD24 or CMD 25 while the specific command CMD22 and corresponding first partial address parameter are not received, then the processing circuit 1201 of controller 120 is arranged to determine that the first partial address parameter is equal to zero and the host device 105 is arranged to write one or more data units having 32-bit length logical addresses.

Figure 5:
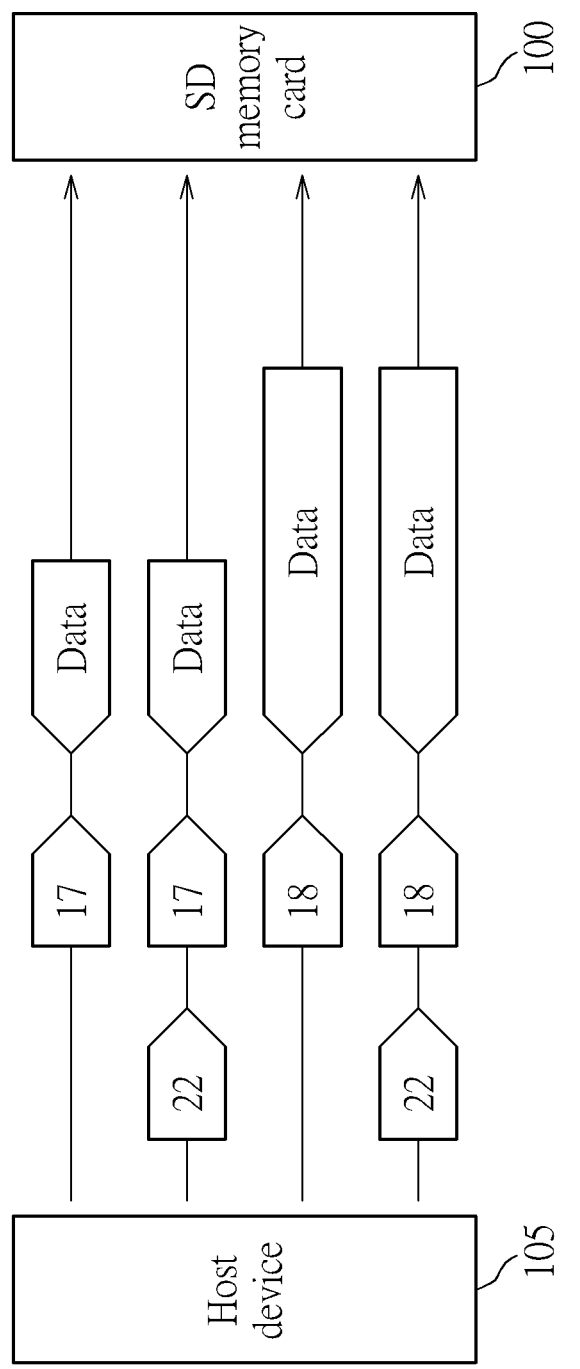
FIG. 5 is a diagram showing the host device sending different commands to the SD memory card to perform data unit read operations based on logical addresses having different bit-lengths according one embodiment of the invention.

Refer to FIG. 5, which is a diagram showing the host device 105 sending different commands to the SD memory card 100 to perform data unit read operations based on logical addresses having different bit-lengths according one embodiment of the invention. As shown by FIG. 5, for sending a 32-bit length logical address associated with a read command to the SD memory card 100, the host device 105 for example sends the command CMD17 and a 32-bit length address parameter such as a logical address of a single data unit to the SD memory card 100 by using the SD memory card driving circuit 1051, and then reads back the single data unit from the SD memory card 100. For sending a 64-bit length logical address associated with a read command to the SD memory card 100, the host device 105 for example sending a specific command such as a first command CMD22 and a first partial address parameter such as 32 most significant bits of the 64-bit length logical address to the SD memory card 100 by using the SD memory card driving circuit 1051, and then sends the command CMD17 and a second partial address parameter such as 32 least significant bits of the 64-bit length logical address to the SD memory card 100, and then reads back a single data unit corresponding the 64-bit length logical address from the SD memory card 100.

For a read operation of multiple data units, when sending a 32-bit length logical address associated with a read command (for reading multiple data units) to the SD memory card 100, the host device 105 for example sends the command CMD18 and a 32-bit length address parameter such as a logical address of a single data unit to the SD memory card 100 by using the SD memory card driving circuit 1051, and then reads back the multiple data units from the SD memory card 100 wherein the 32-bit length address parameter may be a read start logical address of the multiple data units.

Additionally, when sending a 64-bit length logical address associated with a read command (for reading multiple data units) to the SD memory card 100, the host device 105 for example sends a specific command such as the first command CMD22 and a first partial address parameter such as 32 most significant bits of the 64-bit length logical address to the SD memory card 100 by using the SD memory card driving circuit 1051, then sends the command CMD18 and a second partial address parameter such as 32 least significant bits of the 64-bit length logical address to the SD memory card 100, and then reads back the multiple data units from the SD memory card 100 wherein a 64-bit length address parameter formed by the first partial address parameter and the second partial address parameter may be a read start logical address of the multiple data units.

Thus, the processing circuit 1201 of controller 120 can obtain the first partial address parameter when receiving the specific command such as CMD22, and then can obtain the second partial address parameter when receiving the command CMD17 or CMD18. The processing circuit 1201 can obtain the 64-bit length address parameter by combining the first partial address parameter and the second partial address parameter, and then can know the read command is associated with single one data unit or multiple data units according to the command type of the command CMD17 or CMD18. Thus, the processing circuit 1201 can correctly perform the read operation associated with one or multiple data units based on the 64-bit length logical address.

Instead, if the processing circuit 1201 of controller 120 merely receives the command CMD17 or CMD18 and the corresponding second partial address parameter while the specific command CMD22 and a corresponding first partial address parameter are not received, then the processing circuit 1201 of controller 120 is arranged to determine that the first partial address parameter is equal to zero and decides that the host device 105 is arranged to read one or more data units based on 32-bit length logical address(es).

Figure 6:
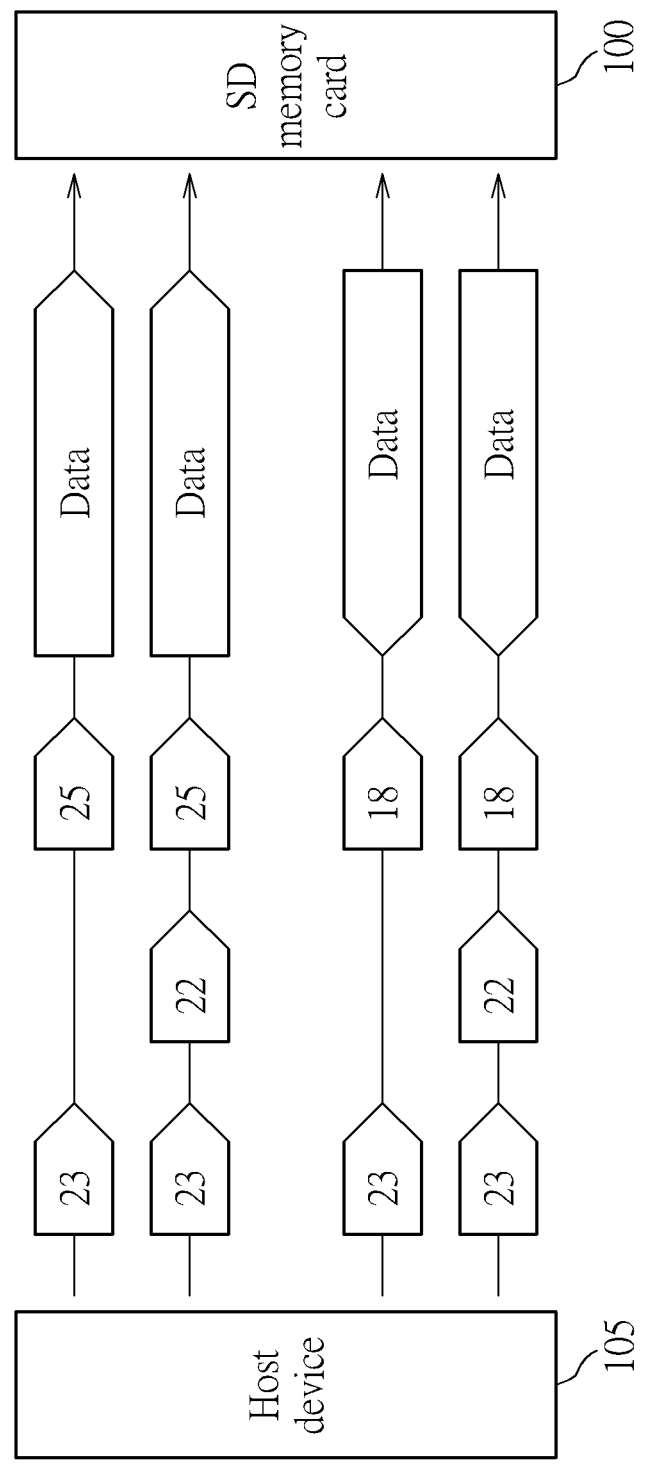
FIG. 6 is a diagram showing the host device sending different commands to the SD memory card 100 to perform read and write operations based on designation data read and write lengths according to embodiments of the invention.

Additionally, the host device 105 may be arranged to send a command CMD23 to indicate a data write/read length before sending the first command CMD22. Refer to FIG. 6, which is a diagram showing the host device 105 sending different commands to the SD memory card 100 to perform read and write operations based on designation data read and write lengths according to embodiments of the invention. As shown in FIG. 6, the host device 105 for example sends the command CMD23 and transmits a designation data length parameter to the SD memory card 100 by using the SD memory card driving circuit 1051, then sends the command CMD25 and the 32-bit length address parameter such as a logical address of a single one data unit to the SD memory card 100, and then sends multiple data units corresponding to the designation data length parameter to the SD memory card 100, to write the multiple data units of the designation data length parameter corresponding to a 32-bit length logical address. The 32-bit length logical address is a start address of the multiple data units of the designation data length parameter.

Additionally, the host device 100 for example sends the command CMD23 and a designation data length parameter to the SD memory card 100 by using the SD memory card driving circuit 1051, then sends a specific command such as the first command CMD22 (but not limited) and a first partial address parameter such as 32 most significant bits of a 64-bit length logical address, then sends the command CMD25 and a second partial address parameter such as 32 least significant bits of the 64-bit length logical address to the SD memory card 100, and then sends multiple data units corresponding to the designation data length parameter to the SD memory card 100, to write the multiple data units corresponding to the designation data length parameter corresponding to the 64-bit length logical address. The 64-bit length logical address is a start address of the multiple data units of the designation data length parameter, and can be obtained by combining the first partial address parameter and the second partial address parameter.

Additionally, for reading data, the host device 105 for example an indication command CMD23 and an designation read data length parameter to the SD memory card 100 by using the SD memory card driving circuit 1051, then sends the command CMD18 and the 32-bit length address parameter such as a logical address of a single one data unit to the SD memory card 100, and then reads back multiple data units corresponding to the designation read data length parameter from the SD memory card 100. The 32-bit length address parameter is a start address of the multiple data units corresponding to the designation read data length parameter.

Additionally, the host device 105 for example sends the command CMD23 and transmits a designation read data length parameter to the SD memory card 100 by using the SD memory card driving circuit 1051, then sends a specific command such as the first command CMD22 (but not limited) and transmits a first partial address parameter such as 32 most significant bits of a 64-bit length logical address, then sends the command CMD25 and the second partial address parameter such as 32 least significant bits of the 64-bit length logical address to the SD memory card 100, and then reads back multiple data units corresponding to the designation read data length parameter from the SD memory card 100. The 64-bit length address parameter is a start address of the multiple data units corresponding to the designation read data length parameter, and can be obtained by combining the first partial address parameter and the second partial address parameter.

Figure 7:
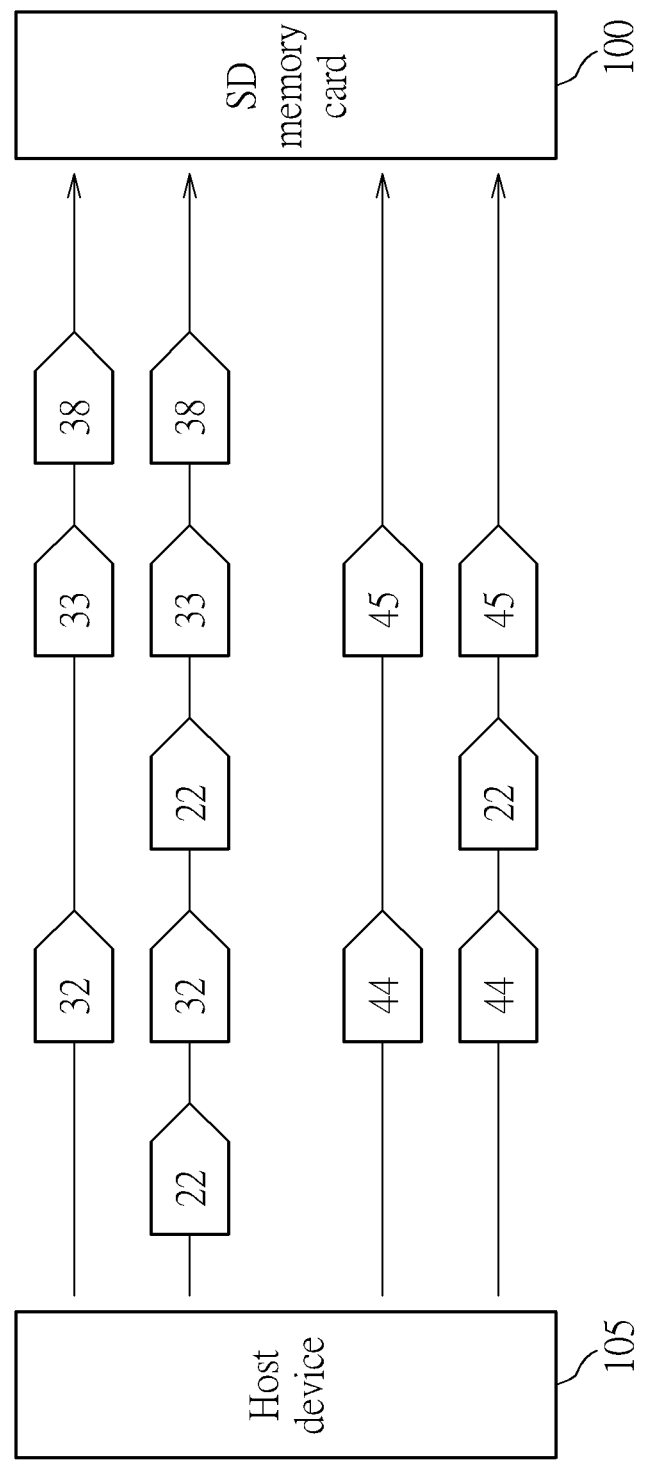
FIG. 7 is a diagram showing the host device sending different commands to the SD memory card to perform the block erase operation and the block transfer operation of the command queue task assignment according to embodiments of the invention.

Further, the above-mentioned operations can be applied in embodiments of block erase and block transfer of a command queue task assignment. Refer to FIG. 7, which is a diagram showing the host device 105 sending different commands to the SD memory card 100 to perform the block erase operation and the block transfer operation of the command queue task assignment according to embodiments of the invention. As shown in FIG. 7, the host device 105 for example sends the command CMD32 and transmits the 32-bit length designation erase start address parameter to the SD memory card 100 by using the SD memory card driving circuit 1051, then sends the command CMD33 and transmits a 32-bit length designation erase end address parameter to the SD memory card 100, and then sends a command CMD38 to the SD memory card 100, to perform the block erase operation. Thus, when the processing circuit 1201 of controller 120 sequentially receives the command CMD32, the 32-bit length designation erase start address parameter, the command CMD33, the 32-bit length designation erase end address parameter, and the command CMD38, the processing circuit 1201 of controller 120 can correspondingly perform the block erase operation upon block content of an designated address segment to be erased.

Additionally, the host device 105 for example uses the SD memory card driving circuit 1051 to send a specific command such as the first command CMD22 (but not limited) and transmit a first partial address parameter such as 32 most significant bits of a 64-bit length logical address to the SD memory card 100, and then to send the command CMD32 and transmit a second partial address parameter such as 32 least significant bits of the 64-bit length logical address to the SD memory card 100. The above-mentioned first partial address parameter and second partial address parameter can be combined to obtain a 64-bit length designation erase start address parameter. The host device 105 then uses the SD memory card driving circuit 1051 to send the specific command CMD22 and transmit another first partial address parameter such as 32 most significant bits of the 64-bit length logical address, and then to send the command CMD33 and transmit another second partial address parameter such as 32 least significant bits of the 64-bit length logical address to the SD memory card 100. The above another first partial address parameter and another second partial address parameter can be combined to obtain a 64-bit length designation erase end address parameter. The host device 105 finally sends the command CMD38 to the SD memory card 100 to perform the block erase operation. Thus, when sequentially receiving the above-mentioned commands and corresponding parameters, the processing circuit 2101 of controller 120 can combine the partial address parameters to obtain the 64-bit length designation erase start address parameter and the 64-bit length designation erase end parameter, and thus performs the block erase operation upon data content of a 64-bit length address segment indicated by the designation erase parameters.

Further, for data unit transfer of the command queue task assignment, the host device 105 for example uses the SD memory card driving circuit 1051 to send a first transfer command CMD44 and transmit transfer parameter information of data read/write, priority, task ID, and the total number of data units to the SD memory card 100, and then to send a second transfer command CMD45 and transmit a 32-bit length designation data unit start address parameter corresponding to the task ID to the SD memory card 100. Thus, when sequentially receiving the above-mentioned commands and corresponding parameters, the processing circuit 1201 of controller 120 can perform the data unit transfer operation based on a 32-bit length start address.

Additionally, for data unit transfer of a 64-bit length address, the host device 105 for example uses the SD memory card driving circuit 1051 to send the command CMD44 and transmit parameters of data read/write, priority, task ID, and the total number of data units to the SD memory card 100, then to send a specific command such as the first command CMD22 (but not limited) and transmit the first partial address parameter corresponding to the task ID, e.g. 32 most significant bits of a 64-bit length logical address, to the SD memory card 100, and then to a second transfer command CMD45 and transmit the second partial address parameter corresponding to the task ID, e.g. 32 least significant bits of the 64-bit length logical address, to the SD memory card 100. Thus, when sequentially receiving the above-mentioned commands and corresponding parameters, the processing circuit 1201 of controller 120 can combine and obtain the 64-bit length start address and then perform the data unit transfer operation based on the 64-bit length start address.

According to the embodiments of the invention, the processing circuit 1201 of controller 120 is arranged to combine and obtain a longer bit-length address parameter after receiving the first partial address parameter and second partial address parameter. For example, the processing circuit 1201 can combine the two 32-bit length partial address parameters to obtain a complete 64-bit length address parameter, and then perform a corresponding operation such as a task assignment of a command queue, data unit read/write, and erase according to the corresponding command type. In other words, the provided method of the invention is to send the first command and transmit the first partial address parameter to the SD memory card and then to send the second command and transmit the second partial address parameter to the SD memory card, to make the processing circuit 1201 of controller 120 of SD memory card be able to refer to the first and second partial address parameters to obtain and obtain a longer bit length address parameter such as a 64-bit length address parameter and then perform the operations of task assignment of command queue, data unit read/write, or erase. Further, the first partial address parameter can be a high-order bit address parameter, and the second partial address parameter can be a low-order bit address parameter. In addition, the first partial address parameter can be a low-order bit address parameter, and the second partial address parameter is a high-order bit address parameter. These modifications all fall within the scope of the invention. Further, the above-mentioned specific command can be a first command such as a reserved command specified in the SD memory card specification, and is not limited as the command CMD22; the first command can be one of other commands CMD31, CMD39, CMD41, and CMD51.

Additionally, it is not necessary for the provided method of the invention to further implement additional pin(s) or port(s). To implement addressing of a longer bit length address space, only the original pins or ports compatible with the addressing of 32-bit length address space is needed. The following table shows an example of pin numbers, names, types, and corresponding descriptions of an SD mode of a specific SD memory card in the embodiments of the invention:

| Pin number | SD mode | | |
|---|---|---|---|
| | Name | Type | Description |
| 1 | CD/DAT3 | I/O/PP | Card detection/Data line 3 [Bit 3] |
| 2 | CMD | I/O/PP | Command/Response |
| 3 | VSS1 | S | Ground |
| 4 | VDD | S | Power supply |
| 5 | CLK | I | Clock |
| 6 | VSS2 | S | Ground |
| 7 | DAT0 | I/O/PP | Data line 0 [Bit 0] |
| 8 | DAT1 | I/O/PP | Data line 1 [Bit 1] |
| 9 | DAT2 | I/O/PP | Data line 2 [Bit 2] |

'S' means the power supply, 'I' means the input, 'O' means the push-pull driving output, and 'PP' means the push-pull driving input and output. The above-mentioned commands are transmitted via the CMD pin, and data is transmitted via the pins of DAT0, DAT1, DAT2, and CD/DAT3.

Figure 8:
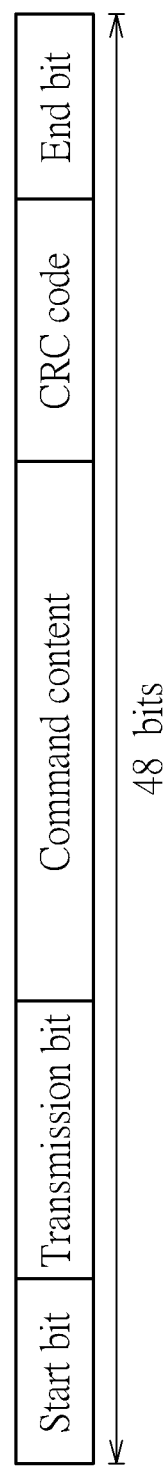
FIG. 8 is a diagram of an example of a command transmission format of a SD memory card according to the embodiments of the invention.

Refer to FIG. 8. FIG. 8 is a diagram of an example of a command transmission format of a SD memory card according to the embodiments of the invention. As shown in FIG. 8, each of the above-mentioned commands for example is transmitted via the CMD pin based on such command transmission format. For example, each command of the first command, read commands, and write commands when transmitted from the driving circuit 1051 of host device 105 to the SD memory card 100 via the second signal port and first signal port for example includes a start bit '0', a transmission bit '1', a command content, a CRC parity check code, and an end bit '1' which are transmitted sequentially wherein the command content includes a command type (e.g. first, read, or write) formed by multiple bits and address information or parameter such as the 32-bit length partial address parameter mentioned above which are transmitted sequentially. The CRC parity check code for example is a checksum formed by seven bits. The command transmission format for example has a total bit length of 48 bits. Accordingly, when sequentially receiving the start bit '0' and the transmission bit '1' at the CMD pin of first signal port via the internal bus, the controller 120 can detect that the host device 105 is transmitting a command to the SD memory card 100. The controller 120 can sequentially receive and obtain the information of command type and information of address parameter according to the command transmission format and can check whether an error occurs in bit information of the transmitted command by using the CRC parity check code. Finally, when detecting the end bit '1', the controller 120 can know the end position of the transmitted command.

Figure 9:
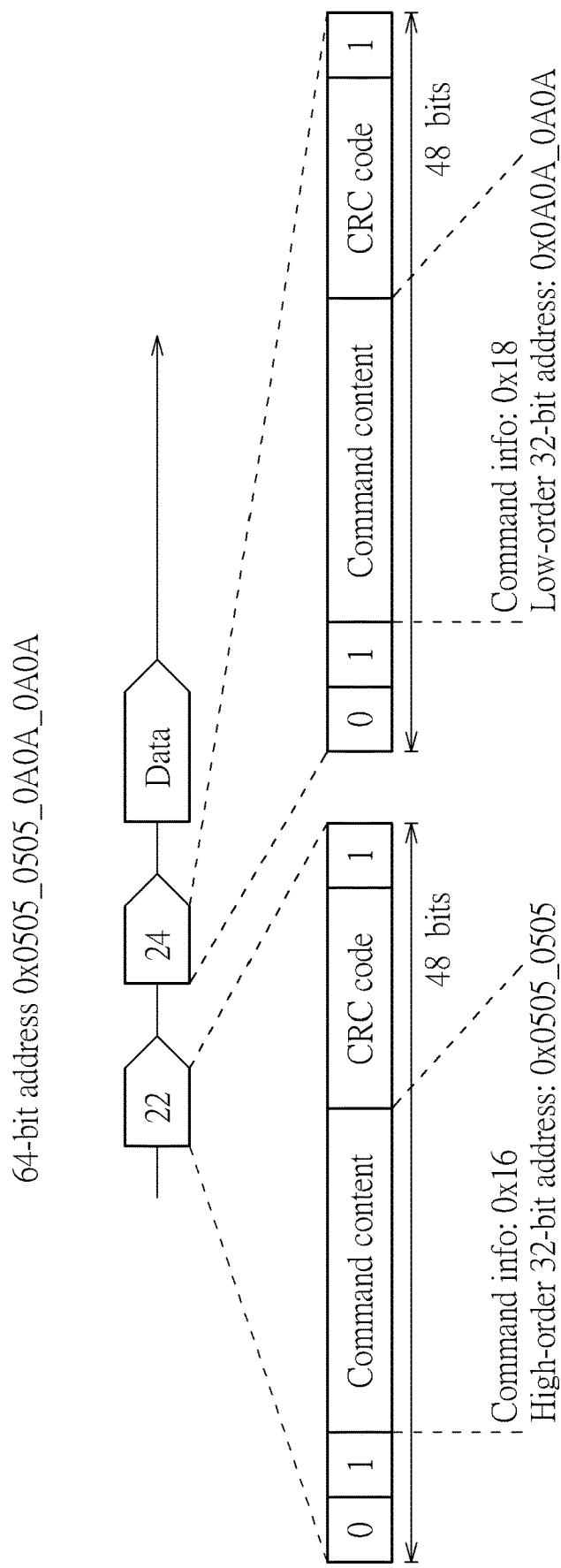
FIG. 9 is a diagram showing an example of the command transmission format of the host device sending the command CMD22 and write command CMD24 to write data to the SD memory card according to the embodiments of the invention.

Refer to FIG. 9. FIG. 9 is a diagram showing an example of the command transmission format of the host device 105 sending the command CMD22 and write command CMD24 to write data to the SD memory card 100 according to the embodiments of the invention. For example, as shown by FIG. 9, the host device 105 is arranged to write data with a 64-bit length address such as 0x0505_0505_0A0A_0A0A (but not limited). When sending the command CMD22, the host device 105 sequentially sends the start bit '0', the transmission bit '1', the command content of command CMD22, the CRC parity check code of command CMD22, and corresponding end bit '1'. Then the host device 105 sends another start bit '0', another transmission bit '1', the command content of command CMD24, the CRC parity check code of command CMD24, and corresponding end bit '1', and then transmits data to be written. The command content of command CMD22 carries information of the command type of CMD 22, e.g. 0x16, and the 32 most significant bits of the 64-bit length address, e.g. 0x0505_0505. The command content of command CMD24 carries information of the command type of CMD24, e.g. 0x18, and the 32 least significant bits of the 64-bit length address, e.g. 0x0A0A_0A0A. After receiving the information of the command types of the two commands and corresponding address information/parameters, the processing circuit 1201 of controller 120 can combine and obtain the 64-bit length address and can decide that the operation to be performed requested by the host device 105 is a write command operation. It should be noted that the commands CMD22 and CMD24 are merely used as examples for explaining the information of a command type and corresponding address information. These examples are not meant to be limitations of the invention.

Additionally, based on the teachings of the invention, one person skilled in the art would be able to appreciate that in another embodiment the command content of command CMD22 carries the address information (e.g. 0x0505_0505) representing the 32 least significant bits of a 64-bit length address such as 0x0A0A_0A0A 0505_0505 (but not limited) and the command content of the write command CMD24 carries the address information (e.g. 0x0A0A_0A0A) representing the 32 most significant bits of the 64-bit length address such as 0x0A0A_0A0A 0505_0505 (but not limited) when the host device 105 performs data write based on such 64-bit length address. In other words, under a condition that the host device 105 sends the commands CMD22 and CMD24 sequentially, the command CMD22 and command CMD24 can be respectively used to transmit a portion and another portion of a 64-bit length address. In addition, when the flash memory controller 120 receives a portion and another portion of a 64-bit length address, the controller 120 can also correctly combine and obtain a complete 64-bit length address according to the command communication protocol between the host device 105 and controller 120. These modifications all fall within the scope of the invention.

Figure 10:
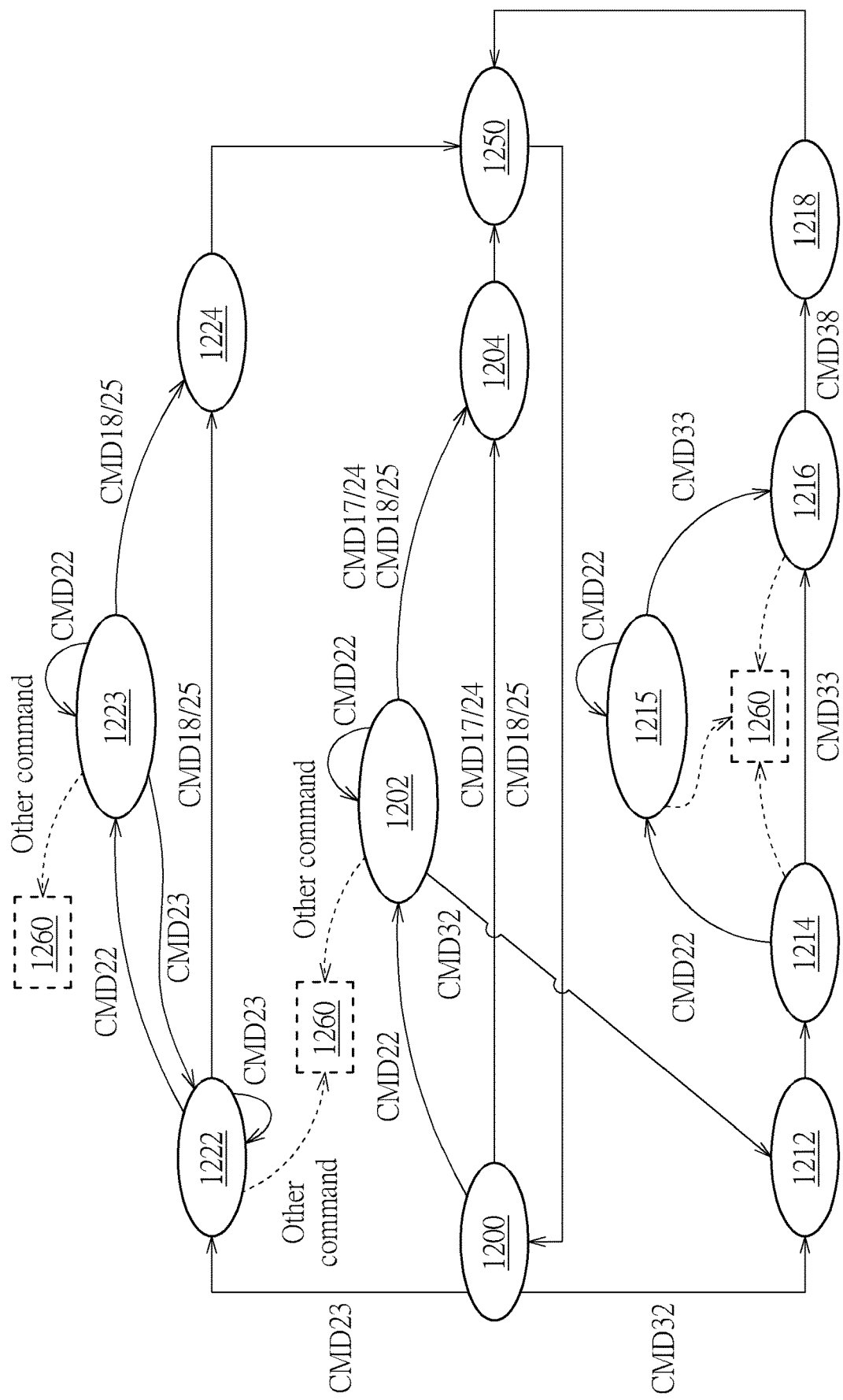
FIG. 10 is a state diagram of the operations of the SD memory card according to embodiments of the invention.

FIG. 10 is a state diagram of the operations of the SD memory card 100 according to embodiments of the invention. As shown in FIG. 10, suppose that the state diagram begins at the state 1200. The state 1200 is a data transfer state. In this state, the SD memory card 100 does not yet receive any one access command. That is, the SD memory card 100 does not yet receive 32 most significant bits and 32 least significant bits of any one 64-bit length logical address. If the SD memory card 100 in the state 1200 receives a command CMD17, CMD18, CMD24, or CMD25, then this indicates that the SD memory card 100 receives merely a 32-bit length address parameter. The SD memory card 100 receives 32 least significant bits of the 64-bit length logical address carried by the command CMD17, CMD18, CMD24, or CMD25. The SD memory card 100 then enters the state 1204. The state 1204 is a state of obtaining a low-order bit address parameter. The SD memory card 100 then enters the state 1250 from the state 1204. The state 1250 is an execution or rejection state. For example, if the SD memory card 100 in the state 1250 merely receives 32 least significant bits of a 64-bit length logical address carried by the command CMD17, CMD18, CMD24, or CMD25, the 32 least significant bits is regarded as a 32-bit length address for the corresponding execution operation. In this situation, the controller 120 of SD memory card 100 is arranged to perform a read/write operation upon the flash memory 110 based on the 32-bit length address. If a command cannot be executed (e.g. the address of the command is out of the range or a command is a write command but the determined address is associated with a read-only area and thus cannot be written), the SD memory card 100 rejects the execution operation. Then, the SD memory card 100 switches from state 1250 to the state 1200.

If a command CMD 22 is received in the state 1200, then this indicates that the SD memory card 100 receives 32 most significant bits of a 64-bit length logical address carried by the command CMD22. The SD memory card 100 then enters the state 1202 which is a state of obtaining a high-order bit address parameter. In the state 1202, if the command CMD22 is received again, then SD memory card 100 is arranged to update the 32 most significant bits of the 64-bit length logical address according the last received command CMD22. If in the state 1202 the SD memory card 100 receives the command CMD17, CMD18, CMD24, or CMD25, then the SD memory card 100 enters the state 1204. This indicates that the SD memory card 100 receives the 32 least significant bits of the 64-bit length logical address carried by the command CMD17, CMD18, CMD24, or CMD25. In this situation, when entering the state 1250, the controller 120 of SD memory card 100 is arranged to perform a data read/write operation upon the flash memory 110 based on the 64-bit length logical address. If a command CMD32 is received in the state 1202, the SD memory card 100 enters the state 1212.

If other commands different from the commands CMD22, CMD17, CMD18, CMD24, CMD25, and CMD32 are received in the state 1202, then the SD memory card 100 enters the state 1260. When entering the state 1260, the SD memory card 100 is arranged goes back to the data transfer state 1200.

If a command CMD 23 is received in the state 1200, this indicates that the SD memory card 100 receives a command of a designation read/write data length. The SD memory card 100 enters the state 1222 which is a state of a high-order bit address parameter being zero. That is, the 32 most significant bits of a 64-bit length logical address are not received. If in the state 1222 the command CMD23 are received repeatedly, the SD memory card 100 keeps in the state 1222. If in the state 1222 the command CMD22 is received, then this indicates that the SD memory card 100 currently receives the 32 most significant bits of the 64-bit length logical address carried by the command CMD22. Then the SD memory card 100 enters the state 1223.

The state 1223 is a state of obtaining a high-order bit address parameter. If in the state 1223 the command CMD23 is received again, this indicates that the previously received command CMD22 fails. The SD memory card 100 switches from the state 1223 into the state 1222. If in the state 1223 other commands are received, the SD memory card 100 enters the state 1260. When entering the state 1260, the SD memory card 100 is arranged to go back to the data transfer state 1200. If in the state 1223 the command CMD18/25 is received, this indicates that the SD memory card 100 currently receives 32 least significant bits of a 64-bit length logical address carried by the command CMD18/25. In this situation, the SD memory card 100 switches to the state 1224 which is a state of obtaining a low-order bit address parameter. Then the SD memory card 100 enters the state 1250 from the state 1224. If the SD memory card 100 receives the 32 most significant bits and 32 least significant bits of the 64-bit length logical address, the controller 120 in the state 1250 is arranged to perform a designation data length read/write operation upon the flash memory 110 based on the 64-bit length logical address.

If the SD memory card 100 in the state 1222 receives the command CMD18/25, this indicates that the SD memory card 100 merely receives a 32-bit length address and then enters the state 1224. Then the SD memory card 100 switches from the state 1224 into the state 1250. In the state 1250 the controller 120 is arranged to perform a designation data length read/write operation upon the flash memory 110 based on a 32-bit length logical address.

If in the state 1200 the command CMD32 is received, this indicates that the SD memory card 100 receives 32-bit address parameter carried by the command CMD32 (the 32-bit address parameter may mean a 32-bit length logical start address or 32 least significant bits of a 64-bit length logical start address). The SD memory card 100 in this situation enters the state 1212 which is a state of obtaining 32 bits of a logical start address. Then the SD memory card 100 enters the state 1214 which is a state of waiting address information.

If in the state 1214 the command CMD33 is received, then this indicates that the SD memory card 100 receives 32-bit address parameter carried by the command CMD33 (the 32-bit address parameter may mean a 32-bit length logical end address or 32 least significant bits of a 64-bit length logical end address). The SD memory card 100 in this situation enters the state 1216 which is a state of obtaining 32 bits of a logical end address. If the command CMD38 is received subsequently, the SD memory card 100 enters the state 1218 which is a state of get an execution operation. Thus, if the SD memory card 100 sequentially passes through the states 1212, 1214, 1216, and 1218, then the controller 120 is arranged to perform an erase operation upon the flash memory 110 based on the 32-bit length logical start address and the 32-bit length logical end address.

If in the state 1214 the command CMD22 is received, then this indicates that the SD memory card 100 receives the 32-bit length address parameter carried by the command CMD22. Since the SD memory card 100 has switched from the state 1212 into the state 1214, so the controller 120 can determine that the command CMD22 received in the state 1214 carries the 32 most significant bits of a 64-bit length logical end address and then enters the state 1215 which is a state of obtaining 32 most significant bits of the 64-bit length logical end address. If in the state 1215 the command CMD22 is received again, this indicates that the host device 105 would like to update the 32 most significant bits of the 64-bit length logical end address. The SD memory card 100 is arranged to update the 32 most significant bits of the 64-bit length logical end address after receiving the new command CMD22.

If in the state 1215 the command CMD33 is received, this indicates that the SD memory card 100 receives the 32-bit length address parameter carried by the command CMD33 (the 32-bit length address parameter is the 32 least significant bits of the 64-bit length logical end address) and then in this situation enters the state 1216 which is a state of obtaining 32 bits of the logical end address. If the command CMD38 is received subsequently, the SD memory card 100 enters the state 1218 which is the state of obtaining an execution operation. Thus, if the SD memory card 100 sequentially passes through the states 1202, 1212, 1214, 1215, 1216, and 1218, then the controller 120 is arranged to perform a data erase operation upon the flash memory 110 according to the 64-bit length logical start address and the 64-bit length logical end address.

It should be noted that, if in any of the states 1202, 1222, 1223, 1214, 1215, and 1216 an unexpected command (other commands different from the above-mentioned commands) is received, then the SD memory card 100 is arranged to switch into the state 1260 and then goes back to the data transfer state 1200.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory card controller configured to couple to a host device via an external signal port and couple to a flash memory via an internal connection of a memory card device, comprising:
   a processing circuit, used for reading card specific data from the flash memory to store the card specific data in a register wherein a multiplier parameter and a basic capacity are marked in the card specific data, and used for sending the card specific data to a processor of the host device via the external signal port and a memory card driving circuit of the host device if the processing circuit receives a request command CMD9 from the memory card driving circuit by the processor of the host device, to make the processor of the host device calculate and obtain a maximum capacity of the memory card device according to the multiplier parameter and the basic capacity marked in the card specific data;
   wherein the marked basic capacity is represented by using 22 bits of a C_size field defined in the card specific data, and the marked multiplier parameter is represented by using N capacity indication bits in the card specific data to indicate a value within a range from zero to M to indicate the multiplier parameter within a range from $2^0$ to $2^M$ wherein M is a positive integer greater than one.

2. The memory card controller of claim 1, wherein the host device is arranged to multiply the multiplier parameter with the basic capacity to derive and obtain the maximum capacity of the memory card device.

3. The memory card controller of claim 1, wherein a maximum value of the basic capacity corresponds to an upper limit of a maximum capacity of a 32-bit length logical address space.

4. The memory card controller of claim 1, wherein the card specific data is marked with version information to make the host device preliminarily determine whether the maximum capacity of the memory card device exceed above a maximum capacity corresponding to a specific bit-length address space according to the version information.

5. The memory card controller of claim 1, wherein the card specific data is marked with version information to make the host device determine whether to refer to the multiplier parameter marked in the card specific data to calculate the maximum capacity of the memory card device.

6. The memory card controller of claim 5, wherein when the version information matches with version information of a driving circuit of the host device, the host device is arranged to refer to the multiplier parameter marked in the card specific data to calculate the maximum capacity of the memory card device.

7. A memory card device, comprising:
the memory card controller of claim 1; and
a flash memory.

8. A method utilized in a memory card controller configured to couple to a host device via an external signal port and couple to a flash memory via an internal connection of a memory card device, and comprising:
reading card specific data from the flash memory to store the card specific data in a register wherein a multiplier parameter and a basic capacity are marked in the card specific data; and
sending the card specific data to a processor of the host device via the external signal port and a memory card driving circuit of the host device if the processing circuit receives a request command CMD9 from the memory card driving circuit by the processor of the host device, to make the processor of the host device calculate and obtain a maximum capacity of the memory card device according to the multiplier parameter and the basic capacity marked in the card specific data;
wherein the marked basic capacity is represented by using 22 bits of a C_size field defined in the card specific data, and the marked multiplier parameter is represented by using N capacity indication bits in the card specific data to indicate a value within a range from zero to M to indicate the multiplier parameter within a range from $2^0$ to $2^M$ wherein M is a positive integer greater than one.

9. The method of claim 8, wherein the multiplier parameter is multiplied with the basic capacity to derive and obtain the maximum capacity of the memory card device.

10. The method of claim 8, further comprising:
marking the card specific data with version information to make the host device preliminarily determine whether the maximum capacity of the memory card device exceeds above a maximum capacity corresponding to a specific bit-length address space according to the version information.

11. The method of claim 8, further comprising:
marking the card specific data with version information to make the host device determine whether to refer to the multiplier parameter marked in the card specific data to calculate the maximum capacity of the memory card device.

12. The method of claim 11, wherein when the version information matches with version information of a driving circuit of the host device, the host device is arranged to refer to the multiplier parameter marked in the card specific data to calculate the maximum capacity of the memory card device.

13. An electronic device configured to couple to a memory card device via an external signal port, comprising:
a memory card driving circuit, for driving the memory card device; and
a processor, coupled to the memory card driving circuit, for sending a request command CMD9 to a memory card controller of the memory card device via the memory card driving circuit, for receiving card specific data which is sent by the memory card controller of the memory card device in response to the request command CMD9, for analyzing and reading a multiplier parameter and a basic capacity marked in the card specific data, and for calculating and obtaining a maximum capacity of the memory card device according to the multiplier parameter and the basic capacitor which are marked in the card specific data;
wherein the marked basic capacity is represented by using 22 bits of a C_size field defined in the card specific data, and the marked multiplier parameter is represented by using N capacity indication bits in the card specific data to indicate a value within a range from zero to M to indicate the multiplier parameter within a range from $2^0$ to $2^M$ wherein M is a positive integer greater than one.

14. The electronic device of claim 13, wherein the processor is arranged to multiply the multiplier parameter with the basic capacity to derive and obtain the maximum capacity of the memory card device.

15. The electronic device of claim 13, wherein a maximum value of the basic capacity corresponds to an upper limit of a maximum capacity of a 32-bit length address space.

16. The electronic device of claim 13, wherein the card specific data is marked with version information, and the processor is arranged to preliminarily determine whether the maximum capacity of the memory card device exceeds above a maximum capacity corresponding to a specific bit-length address space according to the marked version information.

17. The electronic device of claim 13, wherein the card specific data is marked with version information, and the processor is arranged to determine whether to refer to the multiplier parameter marked in the card specific data to calculate the maximum capacity of the memory card device according to the marked version information.

18. The electronic device of claim 13, further comprising:
a display device, coupled to the processor;
wherein the display device is arranged to display the calculated maximum capacity of the memory card device on a picture of the display device.

19. A method utilized in an electronic device configured to couple to a memory card device via an external signal port, the electronic device having a processor and a memory card driving circuit to drive the memory card device, and the method comprises:
- using the memory card driving circuit to drive the memory card device;
- sending a request command CMD9 to a memory card controller of the memory card device via the memory card driving circuit;
- receiving card specific data which is sent by the memory card controller of the memory card device in response to the request command CMD9;
- analyzing and reading a multiplier parameter and a basic capacity marked in the card specific data; and
- calculating and obtaining a maximum capacity of the memory card device according to the multiplier parameter and the basic capacitor which are marked in the card specific data;
- wherein the marked basic capacity is represented by using 22 bits of a C_size field defined in the card specific data, and the marked multiplier parameter is represented by using N capacity indication bits in the card specific data to indicate a value within a range from zero to M to indicate the multiplier parameter within a range from $2^0$ to $2^M$ wherein M is a positive integer greater than one.

20. The method of claim 19, wherein the step of calculating and obtaining the maximum capacity of the memory card device comprises:
- multiplying the multiplier parameter with the basic capacity to derive and obtain the maximum capacity of the memory card device.

21. The method of claim 19, wherein a maximum value of the basic capacity corresponds to an upper limit of a maximum capacity of a 32-bit length address space.

22. The method of claim 19, wherein the card specific data is marked with version information, and the method further comprises:
- preliminarily determining whether the maximum capacity of the memory card device exceeds above a maximum capacity corresponding to a specific bit-length address space according to the marked version information.

23. The method of claim 19, wherein the card specific data is marked with version information, and the method further comprises:
- determining whether to refer to the multiplier parameter marked in the card specific data to calculate the maximum capacity of the memory card device according to the marked version information.

24. The method of claim 19, further comprising:
- displaying the calculated maximum capacity of the memory card device on a picture of a display device of the electronic device.

* * * * *